US009436102B2

(12) United States Patent
Kanaya

(10) Patent No.: US 9,436,102 B2
(45) Date of Patent: Sep. 6, 2016

(54) MOVABLE BODY SYSTEM, MOVABLE BODY DRIVE METHOD, PATTERN FORMATION APPARATUS, PATTERN FORMATION METHOD, EXPOSURE APPARATUS, EXPOSURE METHOD, AND DEVICE MANUFACTURING METHOD

(71) Applicant: NIKON CORPORATION, Tokyo (JP)

(72) Inventor: Yuho Kanaya, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 142 days.

(21) Appl. No.: 14/332,000

(22) Filed: Jul. 15, 2014

(65) Prior Publication Data

US 2014/0327899 A1   Nov. 6, 2014

Related U.S. Application Data

(62) Division of application No. 12/463,562, filed on May 11, 2009, now Pat. No. 8,817,236.

(60) Provisional application No. 61/071,695, filed on May 13, 2008.

(51) Int. Cl.
  *G03B 27/42* (2006.01)
  *G03B 27/58* (2006.01)
  *G03F 7/20* (2006.01)

(52) U.S. Cl.
  CPC ......... *G03F 7/7085* (2013.01); *G03F 7/70725* (2013.01); *G03F 7/70775* (2013.01); *Y10T 29/49002* (2015.01)

(58) Field of Classification Search
  CPC .......... G03F 7/70775; G03F 7/70758; G03F 7/70716; G03F 7/70725; G03F 7/707; G03F 7/70691; G03F 7/70825; G03F 7/7085; Y10T 29/49002
  USPC .............. 355/52, 53, 55, 72–77; 250/442.11, 250/492.1, 492.2, 492.22; 430/5, 8, 22, 30, 430/311; 356/399–401
  See application file for complete search history.

(56) References Cited

U.S. PATENT DOCUMENTS 4,780,617 A    10/1988  Umatate et al.
5,196,745 A     3/1993  Trumper
(Continued)

FOREIGN PATENT DOCUMENTS

CN         1932650 A        3/2007
JP      A 2003-28673        1/2003
(Continued)

OTHER PUBLICATIONS

International Search Report for corresponding Application No. PCT/JP2009/059239, issued Nov. 4, 2009.
(Continued)

*Primary Examiner* — Christina Riddle
(74) *Attorney, Agent, or Firm* — Oliff PLC

(57) ABSTRACT

An exposure apparatus exposes a substrate with an exposure beam via a projection system supported by a frame. A substrate stage having a table that mounts the substrate is placed on a base under the projection system. A measurement device has a plurality of heads provided at the table and each irradiate a measurement beam on a grating section supported by the frame, and measures positional information of the table by a head of the plural heads, that faces the grating section. A drive device drives the substrate stage to move the substrate. A controller controls a drive of the substrate stage based on displacement information of a head used in measurement of the positional information or correction information to compensate a measurement error of the measurement device that occurs due to a displacement of the head, and based on the positional information measured by the measurement device.

35 Claims, 6 Drawing Sheets

(56) References Cited

U.S. PATENT DOCUMENTS

| | | | |
|---|---|---|---|
| 5,448,332 A | 9/1995 | Sakakibara et al. | |
| 5,610,715 A | 3/1997 | Yoshii et al. | |
| 5,646,413 A | 7/1997 | Nishi | |
| 5,969,441 A | 10/1999 | Loopstra et al. | |
| 6,144,119 A * | 11/2000 | Hazelton | G03F 7/70716 |
| | | | 310/12.06 |
| 6,151,100 A * | 11/2000 | Yamane | G03F 7/70716 |
| | | | 355/53 |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,425 B2 | 11/2004 | Kwan | |
| 6,881,963 B2 | 4/2005 | Ito | |
| 7,023,610 B2 | 4/2006 | Ohtsuki et al. | |
| 7,025,498 B2 | 4/2006 | Del Puerto | |
| 7,102,729 B2 | 9/2006 | Renkens et al. | |
| 7,161,659 B2 | 1/2007 | Van Den Brink et al. | |
| 7,238,931 B2 | 7/2007 | Nabeshima et al. | |
| 7,253,875 B1 | 8/2007 | Luttikhuis et al. | |
| 7,256,871 B2 | 8/2007 | Loopstra et al. | |
| 7,289,212 B2 | 10/2007 | Kwan | |
| 7,292,312 B2 | 11/2007 | Loopstra et al. | |
| 7,333,174 B2 | 2/2008 | Koenen et al. | |
| 7,348,574 B2 | 3/2008 | Pril et al. | |
| 7,349,069 B2 | 3/2008 | Beems et al. | |
| 7,362,446 B2 | 4/2008 | Van Der Pasch et al. | |
| 7,405,811 B2 | 7/2008 | Beems et al. | |
| 2002/0041380 A1 | 4/2002 | Kwan | |
| 2002/0109823 A1 | 8/2002 | Binnard et al. | |
| 2003/0025890 A1 | 2/2003 | Nishinaga | |
| 2005/0128461 A1 | 6/2005 | Beems et al. | |
| 2005/0259234 A1 | 11/2005 | Hirukawa et al. | |
| 2006/0007419 A1 | 1/2006 | Streefkerk et al. | |
| 2006/0139660 A1 | 6/2006 | Kwan | |
| 2006/0227309 A1 * | 10/2006 | Loopstra | G03F 7/70775 |
| | | | 355/53 |
| 2007/0051160 A1 * | 3/2007 | Pril | G03F 7/70775 |
| | | | 73/1.79 |
| 2007/0052976 A1 | 3/2007 | Pril et al. | |
| 2007/0076218 A1 | 4/2007 | Van Empel et al. | |
| 2007/0195296 A1 | 8/2007 | Van Der Pasch et al. | |
| 2007/0223007 A1 | 9/2007 | Klaver et al. | |
| 2007/0263191 A1 | 11/2007 | Shibazaki | |
| 2007/0263197 A1 * | 11/2007 | Luttikhuis | G03B 27/53 |
| | | | 355/55 |
| 2007/0288121 A1 | 12/2007 | Shibazaki | |
| 2008/0043212 A1 | 2/2008 | Shibazaki | |
| 2008/0068568 A1 | 3/2008 | Ebihara et al. | |
| 2008/0074681 A1 | 3/2008 | Loopstra et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094604 A1 | 4/2008 | Shibazaki | |
| 2008/0105026 A1 | 5/2008 | Loopstra et al. | |
| 2008/0106722 A1 | 5/2008 | Shibazaki | |
| 2008/0218713 A1 | 9/2008 | Shibazaki | |
| 2008/0240501 A1 | 10/2008 | Van Der Wijst et al. | |
| 2008/0246936 A1 | 10/2008 | Loopstra et al. | |
| 2008/0309950 A1 | 12/2008 | Kwan | |
| 2009/0004580 A1 | 1/2009 | Kanaya | |
| 2009/0097002 A1 | 4/2009 | Fukuda et al. | |
| 2009/0190110 A1 | 7/2009 | Shibazaki | |
| 2009/0224444 A1 | 9/2009 | Mayama et al. | |

FOREIGN PATENT DOCUMENTS

| | | |
|---|---|---|
| JP | A-2007-071874 | 3/2007 |
| JP | A-2007-129194 | 5/2007 |
| WO | WO 01/35168 A1 | 5/2001 |
| WO | WO 2005/074014 A1 | 8/2005 |
| WO | WO 2007/083758 A1 | 7/2007 |

OTHER PUBLICATIONS

Written Opinion of the International Searching Authority for corresponding Application No. PCT/JP2009/059239, issued Nov. 4, 2009.

Dec. 1, 2011 Office Action issued in Chinese Patent Application No. 200980117084.4 (with English translation).

Sep. 29, 2011 Office Acton issued in U.S. Appl. No. 12/463,562.

Mar. 15, 2012 Office Acton issued in U.S. Appl. No. 12/463,562.

May 23, 2014 Notice of Allowance issued in U.S. Appl. No. 12/463,562.

May 29, 2014 Office Action issued in Japanese Patent Application No. 2013-176208 (with translation).

* cited by examiner

MOVABLE BODY SYSTEM, MOVABLE BODY DRIVE METHOD, PATTERN FORMATION APPARATUS, PATTERN FORMATION METHOD, EXPOSURE APPARATUS, EXPOSURE METHOD, AND DEVICE MANUFACTURING METHOD

CROSS-REFERENCE TO RELATED APPLICATIONS

This is a divisional of U.S. patent application Ser. No. 12/463,562 filed May 11, 2009, (now U.S. Pat. No. 8,817, 236), which in turn is a non-provisional of U.S. Provisional Application No. 61/071,695 filed May 13, 2008. The disclosures of each of the prior applications are incorporated herein by reference in their entireties.

BACKGROUND OF THE INVENTION

1. Field of the Invention

The present invention relates to movable body systems, movable body drive methods, pattern formation apparatus, pattern formation methods, exposure apparatus, exposure methods, and device manufacturing methods, and more particularly to a movable body system including a movable body which substantially moves along a predetermined plane, a movable body drive method to drive the movable body, a pattern formation apparatus equipped with the movable body system, a pattern formation method which uses the movable body drive method, an exposure apparatus equipped with the movable body system, an exposure method which uses the movable body drive method, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

Semiconductor devices will lead to higher integration in the future, and accompanying this, it is certain that the circuit pattern which should be formed on the wafer will be finer, and further improvement of the position detection precision of wafers and the like will be required in the exposure apparatus which is the mass-production apparatus for semiconductor devices.

For example, in U.S. Patent Application Publication No. 2006/0227309, an exposure apparatus is disclosed which employs an encoder type sensor (an encoder head) installed on a substrate table. However, in the case when an encoder head is installed on a substrate table, the movement of the substrate table (acceleration added to the substrate table) could change the setting position and/or setting attitude of the encoder head with respect to the substrate table, and there was a risk of the accuracy of position measurement of the substrate table using the encoder head being degraded.

SUMMARY OF THE INVENTION

According to a first aspect of the present invention, there is provided a movable body system, the system comprising: a movable body which substantially moves along a predetermined plane; a measurement device having a plurality of encoder heads provided on a surface of the movable body, and measures positional information of the movable body, based on an output of at least one encoder head which faces a grating section placed parallel with the predetermined plane outside the movable body; and a drive device which drives the movable body based on the positional information measured by the measurement device, and information on a relative position between an encoder head used in the measurement of the positional information and the movable body.

According to this system, the movable body is driven, based on the positional information of the movable body within the predetermined plane measured by the measurement device, and the information on the relative position between at least one encoder head which faces the grating section placed in parallel with the predetermined plane used in the measurement of the positional information and the movable body. Accordingly, a highly precise measurement of position information of the movable body, or in turn, a highly precise drive control of the movable body becomes possible even if the encoder head moves with respect to the movable body for movable body in accordance with the drive of the movable body.

According to a second aspect of the present invention, there is provided a pattern formation apparatus that forms a pattern on an object, the apparatus comprising: the movable body apparatus of the present invention in which the object is mounted on the movable body; and a patterning device which generates a pattern on an object mounted on the movable body.

According to this apparatus, it becomes possible to form a pattern on the object with good precision.

According to a third aspect of the present invention, there is provided an exposure apparatus that forms a pattern on an object by an irradiation of an energy beam, the apparatus comprising: a patterning device that irradiates the energy beam on the object; the movable body system of the present invention in which the object is mounted on the movable body; and the movable body on which the object is mounted is driven for relative movement of the energy beam and the object.

According to this apparatus, it becomes possible to form a pattern on the object with good precision by scanning exposure.

According to a fourth aspect of the present invention, there is provided a device manufacturing method, the method including: exposing an object using the exposure apparatus of the present invention; and developing the object which has been exposed.

According to a fifth aspect of the present invention, there is provided a movable body drive method, the method comprising: a measurement process in which of a plurality of encoder heads provided on a surface of a movable body that substantially moves along a predetermined plane, positional information of the movable body is measured, based on an output of at least one encoder head which faces a grating section placed parallel with the predetermined plane outside the movable body; and a drive process in which the movable body is driven, based on the positional information that has been measured, and information on a relative position between an encoder head used in the measurement of the positional information and the movable body.

According to this method, in the drive process, the movable body is driven, based on the positional information of the movable body within the predetermined plane measured in the measurement process, and the information on the relative position between at least one encoder head which faces the grating section placed in parallel with the predetermined plane used in the measurement of the positional information and the movable body. Accordingly, a highly precise measurement of position information of the movable body, or in turn, a highly precise drive control of the movable body becomes possible even if the encoder head moves with respect to the movable body for movable body in accordance with the drive of the movable body.

According to a sixth aspect of the present invention, there is provided a pattern formation method to form a pattern on an object, the method comprising: a drive process in which a movable body holding the object is driven along a predetermined plane, using the movable body drive method of the present invention, to form the pattern.

According to this apparatus, it becomes possible to form a pattern on the object with good precision.

According to a seventh aspect of the present invention, there is provided an exposure method in which a pattern is formed on an object by irradiating an energy beam, the method comprising: a drive process in which a movable body holding the object is driven, using the movable body drive method of the present invention, to form the pattern.

According to this method, it becomes possible to form a pattern on the object with good precision by exposing the object with the irradiation of the energy beam.

According to an eighth aspect of the present invention, there is provided a device manufacturing method, the method including: an exposure process in which an object is exposed using the exposure method of the present invention; and a developing process in which the object which has been exposed is developed.

BRIEF DESCRIPTION OF THE DRAWINGS

In the accompanying drawings.

DESCRIPTION OF THE EMBODIMENTS

An embodiment of the present invention will be described below, with reference to FIGS. 1 to 6.

Figure 1:
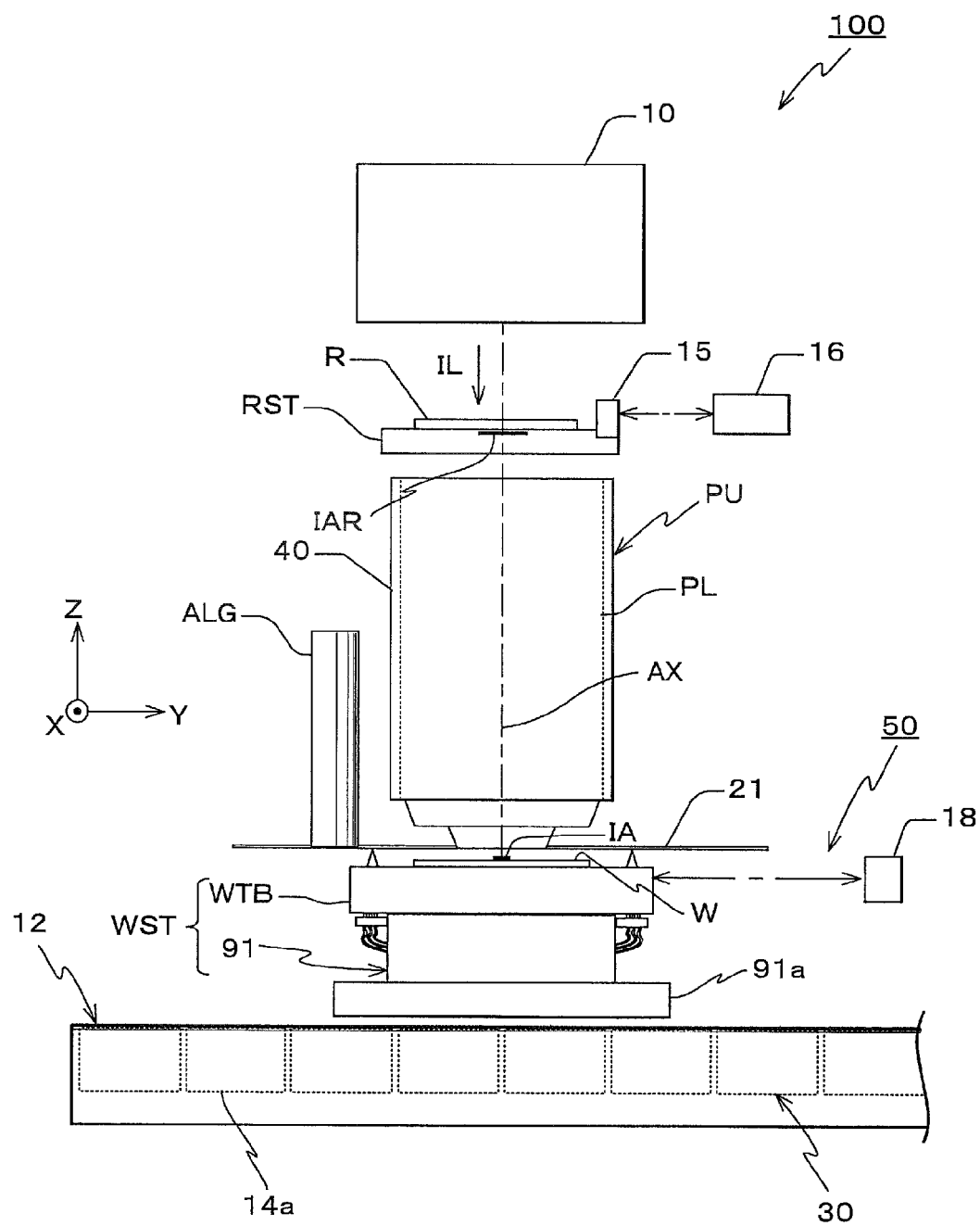
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST holding reticle R, a projection unit PU, a wafer stage device 50 including wafer stage WST on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a predetermined scanning speed.

The positional information (including position information (hereinafter also referred to as θz rotation quantity) in the θz direction) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1. Incidentally, the encoder system which is disclosed in, for example, U.S. Patent Application Publication No. 2007/0288121 and the like, can be used instead of, or together with reticle interferometer 16 to measure the positional information of reticle R at least in directions of three degrees of freedom.

Projection unit PU is placed below (−Z side) reticle stage RST in FIG. 1, and is held by a mainframe (metrology frame) which configures a part of a body (not shown). Projection unit PU has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by the synchronous drive of reticle stage RST and wafer stage WST, reticle R relatively moves in the scanning direction (the Y-axis direction) with respect to illumination area IAR (illumination light IL) while wafer W relatively moves in the scanning direction (the Y-axis direction) with respect to an exposure area (illumination light IL), thus scanning exposure of a shot area (divided area) on wafer W is performed, and the pattern of reticle R is transferred onto this shot area. That is, in the embodiment, the pattern is generated on wafer W according to illumination system 10 and projection optical system PL, and then by the exposure of the sensitive layer (resist layer) on wafer W with illumination light IL, the pattern is formed on wafer W.

Incidentally, the main frame can be one of a gate type frame which is conventionally used, and a hanging support type frame disclosed in, for example, U.S. Patent Application Publication No. 2008/0068568 and the like.

In the periphery on the −Z side end of barrel 40, for example, a scale plate 21 is placed parallel to the XY plane, at a height substantially flush with a surface on the lower end of barrel 40. In the embodiment, scale plate 21 consists of a rectangular plate which has a circular opening in which the −Z end of barrel 40 is inserted and a circular opening in which the −Z end of an alignment system is inserted the circular opening formed in a part of the plate, and is supported by suspension from a body (not shown). In the embodiment, scale board 21 is supported by suspension from a main frame (not shown) (metrology frame) which supports projection unit PU. On the lower surface (a surface on the −Z side) of scale plate 21, as a two-dimensional grating, a reflection type two-dimensional grating RG (refer to FIGS. 4 and 5) is formed, consisting of a grating whose periodic direction is in the Y-axis direction having a predetermined pitch of, for example, 1 μm, and a grating whose periodic direction is in the X-axis direction having a predetermined pitch of, for example, 1 μm. This diffraction grating RG covers the movement range of wafer stage WST.

Wafer stage device 50 is equipped with a stage base 12 supported almost horizontally by a plurality of (for example, three or four) vibration isolation mechanisms (omitted in the drawings) on the floor surface, a wafer stage WST placed on stage base 12, a wafer stage drive system 27 (only a part of the system shown in FIG. 1, refer to FIG. 6), and a measurement system which measures positional information of wafer stage WST (wafer table WTB). The measurement system is equipped with an encoder system 70, a wafer laser interferometer system 18 and the like shown in FIG. 6. Incidentally, encoder system 70 and wafer laser interferometer system 18 will be further described later in the description.

Stage base 12 is made of a member having a tabular form, and the degree of flatness of the upper surface is extremely high and serves as a guide surface when wafer stage WST moves. Inside stage base 12, a coil unit is housed, including a plurality of coils 14a placed in the shape of a matrix with the XY two-dimensional direction serving as a row direction and a column direction.

As shown in FIG. 1, wafer stage WST has a stage main section 91, and a wafer table WTB which is placed above stage main section 91 and is supported in a non-contact manner with respect to stage main section 91 by a Z tilt drive mechanism (not shown). In this case, wafer table WTB is supported in a non-contact manner by Z tilt drive mechanism by adjusting the balance of the upward force (repulsion) such as the electromagnetic force and the downward force (gravitation) including the self-weight at three points, and is also finely driven in directions of three degrees of freedom, which are the Z-axis direction, the θx direction, and the θy direction. At the bottom of stage main section 91, a slider section 91a is arranged. Slider section 91a has a magnetic unit made up of a plurality of magnets arranged two-dimensionally within the XY plane, a housing to house the magnetic unit, and a plurality of air bearings arranged in the periphery of the bottom surface of the housing. The magnet unit configures a planar motor 30 which uses the drive of a Lorentz electromagnetic force as disclosed in, for example, U.S. Pat. No. 5,196,745, along with the coil unit previously described. Incidentally, as planar motor 30, the drive method is not limited to the method using the Lorentz force electromagnetic force, and a planar motor by a variable reluctance drive system can also be used.

Wafer stage WST is supported by levitation above stage base 12 by a predetermined clearance, such as around several μm, by the plurality of air bearings described above, and is driven in the X-axis direction, the Y-axis direction, and the θz direction by planar motor 30. Accordingly, wafer table WTB (wafer W) is movable with respect to stage base 12 in directions of six degrees of freedom. Incidentally, wafer stage WST can be driven in directions of six degrees of freedom by planar motor 30.

Figure 6:
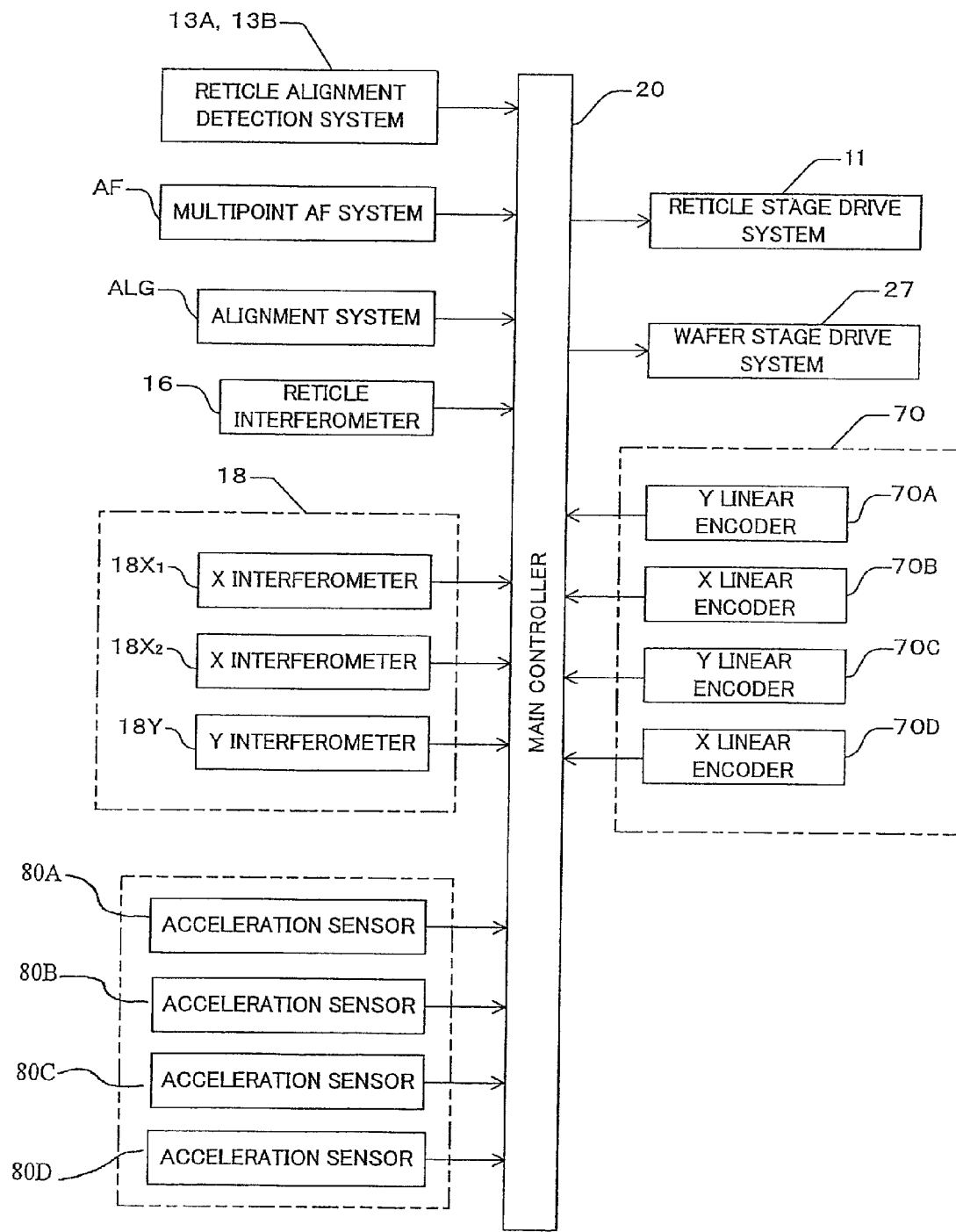
FIG. 6 is a block diagram showing the main configuration of the control system related with the stage control in the exposure apparatus in FIG. 1.

In the embodiment, a main controller 20 controls the magnitude and direction of current supplied each of the coils 14a configuring the coil unit. Wafer stage drive system 27 in FIG. 6 is configured, including planar motor 30 and the Z tilt drive mechanism previously described. Incidentally, planar motor 30 is not limited to a motor using a moving magnet method, and can be a motor using a moving coil method. Or, as planar motor 30, a magnetic levitation type planar motor can be used. In this case, the air bearing previously described does not have to be arranged. Further, wafer table WTB can be finely movable in at least one of the X-axis direction, the Y-axis direction, and the Z-axis direction. More specifically, wafer stage WST can be configured by a rough/fine movement stage.

Figure 2:
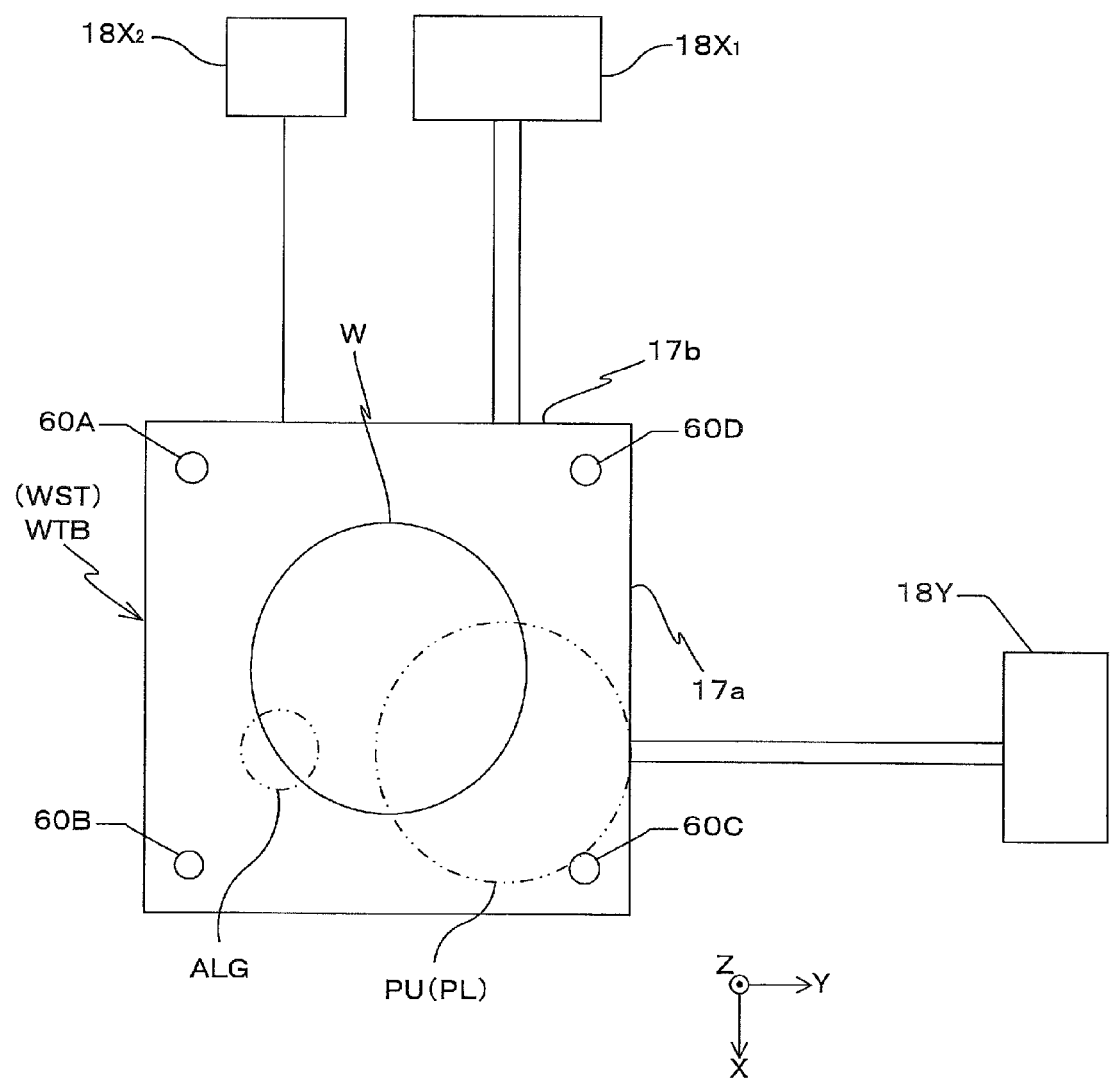
FIG. 2 is a view to explain a placement of an encoder head and an interferometer.

On wafer table WTB, wafer W is mounted via a wafer holder (not shown), and is fixed by a chuck mechanism (not shown), such as, for example, vacuum suction (or electrostatic adsorption). On a surface on the +Y side (the +Y edge surface) and a surface on the −X side (the −X edge surface) of wafer table WTB, respectively, mirror-polishing is applied, and reflection surfaces 17a and 17b which are used in wafer laser interferometer system to be described later are formed as shown in FIG. 2.

Encoder system 70 measures positional information (including information on the θz rotation quantity) of wafer stage WST in the XY plane. Now, a configuration and the like of encoder system 70 will be described in detail.

Figure 3:
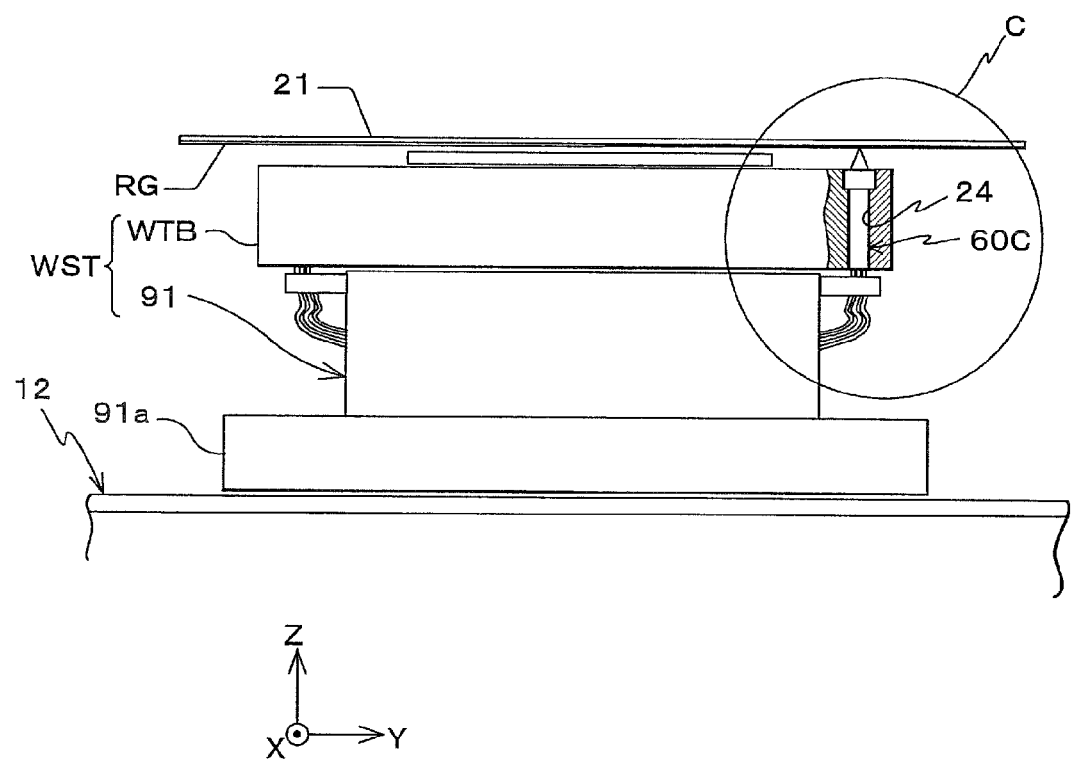
FIG. 3 is an enlarged view where a part of the wafer stage in FIG. 1 is fractured.

On wafer table WTB, as shown in a planar view in FIG. 2, an encoder head (hereinafter, shortly referred to as a head, as needed) 60A, 60B, 60C, and 60D are placed in the four corners, respectively. These heads 60A to 60D are housed within through-holes 24 in the Z-axis direction which have been formed in wafer table WTB, respectively, as shown in FIG. 3 with head 60C taken up as a representative.

A pair of heads 60A and 60C, which is located on one of the diagonal lines of wafer table WTB, is heads whose measurement direction is in the Y-axis direction. Further, a pair of heads 60B and 60D, which is located on the other diagonal line on the upper surface of wafer table WTB, are heads whose measurement direction is in the X-axis direction. As each of the heads 60A to 60D, a head having a configuration similar to the head (encoder) disclosed in, for example, U.S. Pat. No. 7,238,931, International Publication No. 2007/083758 and the like is used. However, in the embodiment, the light source and the photodetector are arranged external to each head, and only the optical system is arranged inside of each head. And the light source, the photodetector, and the optical system are optically connected via an optical fiber which will be described later in the description.

Heads 60A and 60C configure Y linear encoders (hereinafter appropriately shortened to "Y encoders" or "encoders") 70A and 70C (refer to FIG. 6), respectively, which measure the position of wafer stage WST in the Y-axis direction by irradiating measurement beams (measurement lights) on scale plate 21 and receiving diffraction beams from the grating whose periodic direction is the Y-axis direction formed on the surface (lower surface) of scale plate 21. Further, heads 60B and 60D configure X linear encoders (hereinafter appropriately shortened to "encoders") 70B and 70D (refer to FIG. 6), respectively, which measure the position of wafer stage WST in the X-axis direction by irradiating measurement beams on scale plate 21 and receiving diffraction beams from the grating whose periodic direction is the X-axis direction formed on the surface of scale plate 21.

Figure 4:
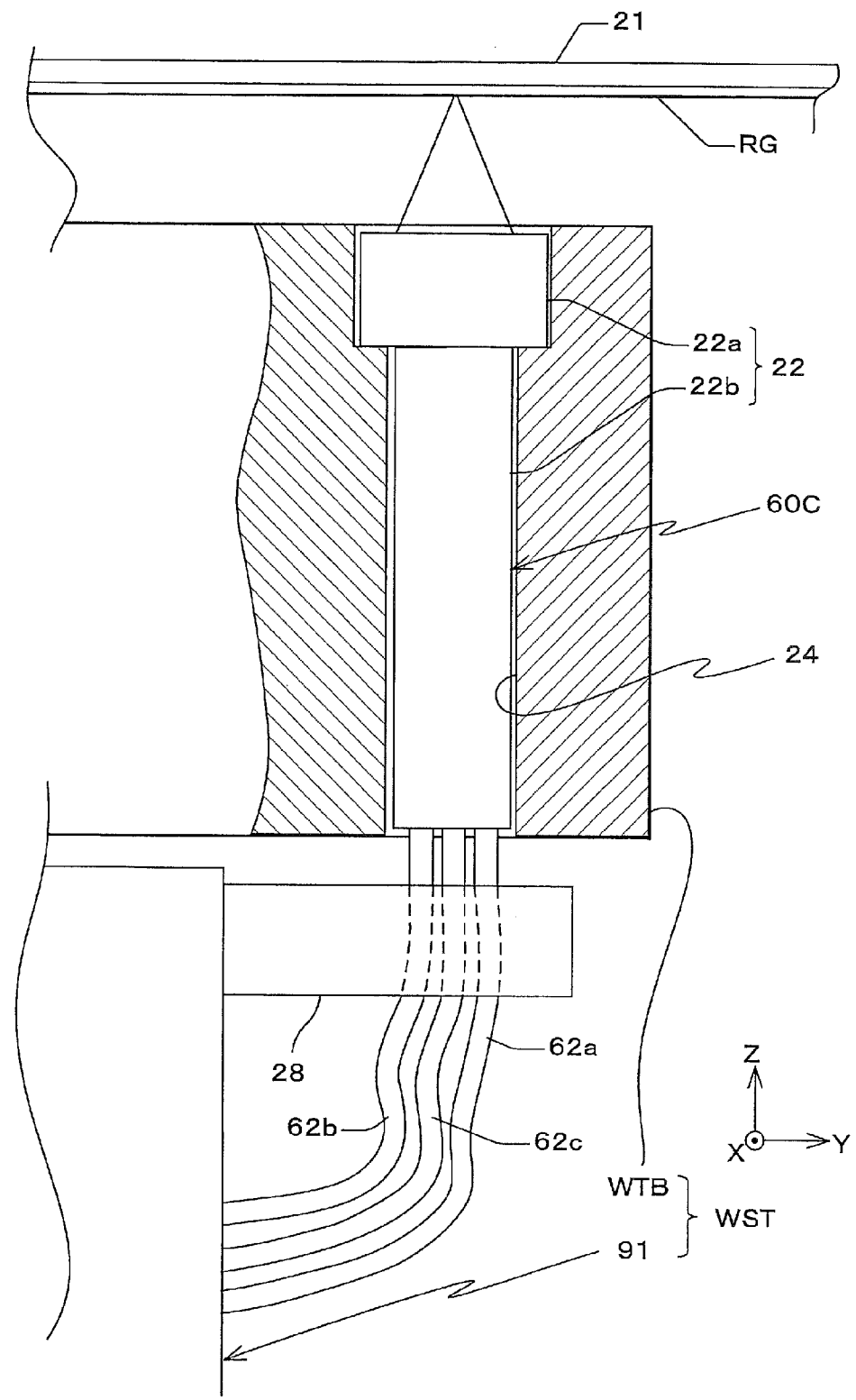
FIG. 4 is a view of a part of circle C in FIG. 3 enlarged.

In the embodiment, as shown in FIG. 4, which is a view of a part of circle C in FIG. 3 enlarged, head 60C has a housing 22 which has two sections; an optical system housing section 22a having a square pillar shape whose height is shorter than the width and the depth, and a cylindrical shaped fiber housing section 22b having a square pillar shape of a predetermined length arranged extending in the Y-axis direction below optical system housing section 22a. A part of optical system housing section 22a extends out fully surrounding the circumference on the outer side of fiber housing section 22b. Through-hole 24 previously described is formed in a shape according to the shape of housing 22, as shown in FIG. 4. And housing 22 is attached to wafer table WTB in a state where the lower surface of the extending section described above contacts a stepped portion of through-hole 24. In this case, in order to make the insertion of housing 22 inside through hole 24 easy, dimensions of both housing 22 and through-hole 24 are set to an extent where a predetermined clearance is formed between an inner wall surface of through-hole 24 and the outer peripheral surface of housing 22.

One end of optical fibers 62a, 62b, and 62c connects, respectively, to housing 22. Optical fibers 62a, 62b, and 62c are held at the lower end of fiber housing section 22b, or more specifically, in the vicinity of the lower surface of wafer table WTB by a fiber holding section 28 arranged on the upper end section of stage main section 91, so that the optical fibers are not stressed even when wafer stage WSB is finely driven with respect to stage main section 91.

Optical fiber 62a is a light-sending fiber, and the other end of the fiber optically connects to a light source (not shown) provided in stage main section 91, such as, for example, to a semiconductor laser. Further, optical fibers 62b and 62c are light-receiving fibers, and each of the other ends optically connect to a first and second photodetection systems (not shown) provided in stage main section 91. The first and second photodetection systems each include a polarizer (analyzer) and a photodetector, such as, for example, a photomultiplier tube and the like. Incidentally, the configuration in housing 22 of optical fibers 62a, 62b, and 62c will be described, later in the description.

A configuration of an optical system housed in housing 22 of head 60C will now be described, based on FIG. 5.

Figure 5:
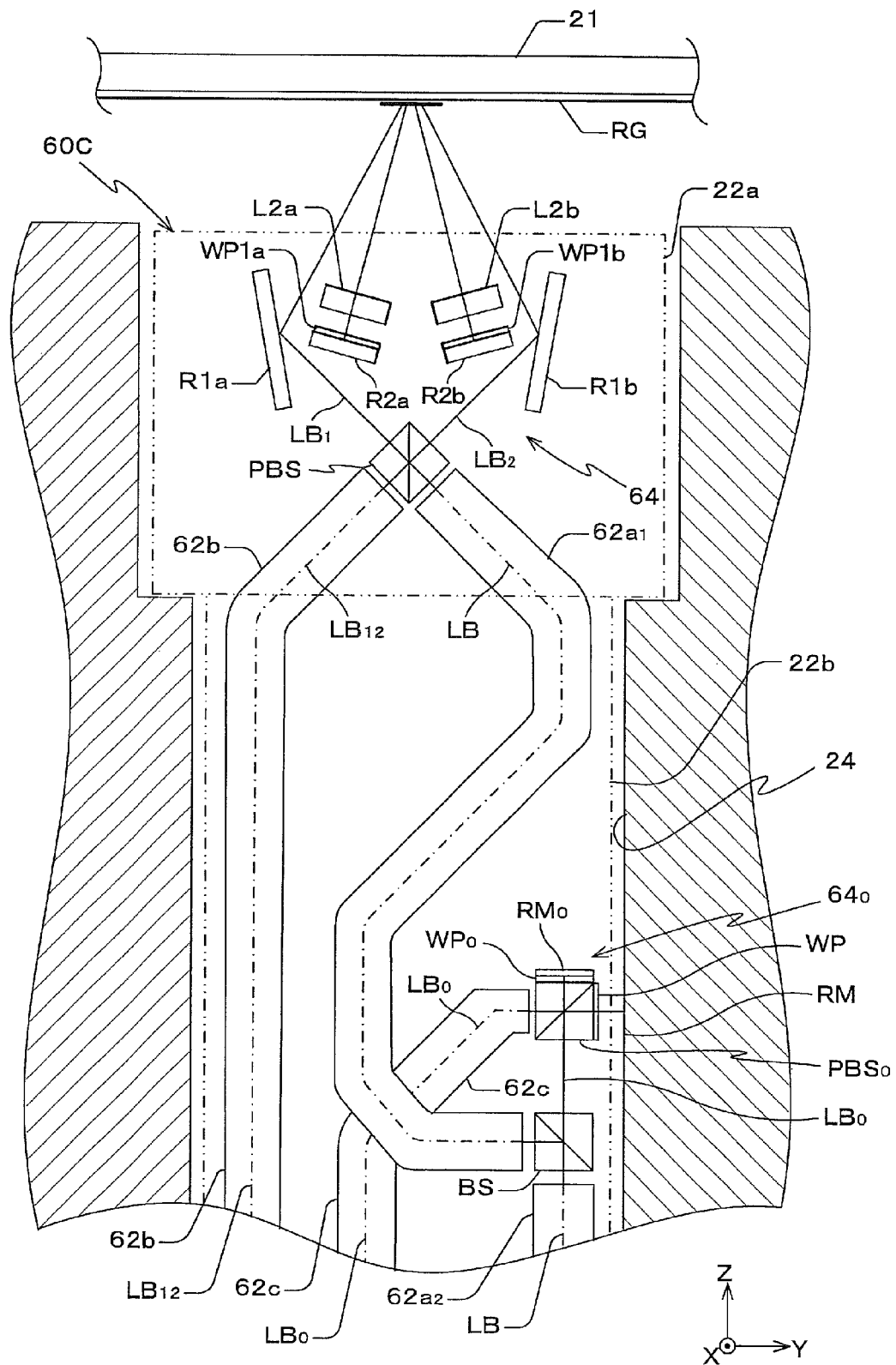
FIG. 5 is a view used to explain a configuration inside the head.

Inside optical system housing section 22a, as shown in FIG. 5, for example, a main optical system 64 consisting of a polarization beam splitter PBS whose separation plane is parallel to an XZ plane, a pair of reflection mirrors R1a and R1b, lenses L2a and L2b, quarter wavelength plates (hereinafter, referred to as $\lambda/4$ plates) WP1a and WP1b, refection mirrors R2a and R2b, and the like fixed to housing 22 in a predetermined positional relation via a support member (not shown) and the like, and a secondary optical system $64_0$ (details to be described later on) are housed.

As shown in FIG. 5, optical fiber 62a is divided into a first section $62a_1$ and a second section $62a_2$ inside housing 22, and the first section $62a_1$ and the second section $62a_2$ are optically connected via a beam splitter BS. Beam splitter BS is fixed to housing 22 via a support member (not shown), in a state where the incidence plane faces an end surface on a side on one end of the second section $62a_2$ of optical fiber 62a and the outgoing plane faces an end surface on a side on the other end of the first section $62a_1$ of optical fiber 62a.

An end surface on a side on one end of the first section 62a1 of optical fiber 62 is placed facing the incidence plane of polarization beam splitter PBS of optical system 64, and an end surface on a side on one end of optical fiber 62b is placed facing the outgoing plane of polarization beam splitter PBS.

In head 60C (Y encoder 70C), a laser beam LB is emitted from a light source (not shown) arranged in stage main section 91, which is incident on polarization beam splitter PBS via optical fiber 62a (or to be more accurate, the second section $62a_2$, beam splitter BS, and the first section $62a_1$), and is split by polarization into two measurement beams $LB_1$ and $LB_2$. Measurement beam $LB_1$ having been transmitted through polarization beam splitter PBS reaches scale plate 21, via reflection mirror R1a, and measurement beam $LB_2$ reflected off polarization beam splitter PBS reaches scale plate 21 via reflection mirror R1b. Incidentally, "split by polarization" in this case means the splitting of an incident beam into a P-polarization component and an S-polarization component.

Predetermined-order diffraction beams that are generated from diffraction grating RG due to irradiation of measurement beams $LB_1$ and $LB_2$, such as, for example, the first-order diffraction beams are severally converted into a circular polarized light by $\lambda/4$ plates WP1a and WP1b via lenses L2a and L2b, and reflected by reflection mirrors R2a and R2b and then the beams pass through $\lambda/4$ plates WP1a and WP1b again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffraction beam of measurement beam $LB_1$ having passed through polarization beam splitter PBS first, is reflected off polarization beam splitter PBS. The first-order diffraction beam of measurement beam $LB_2$ having been reflected off polarization beam splitter PBS first, passes through polarization beam splitter PBS. And the first-order diffraction beams of each of the measurement beams $LB_1$ and $LB_2$ are coaxially synthesized, and is incident on optical fiber 62b as a synthetic beam $LB_{12}$. Synthetic beam $LB_{12}$ is sent to a first photodetection system (not shown) provided in stage main section 91, via optical fiber 62b.

Inside the first photodetection system (not shown), the polarization direction of the first-order diffraction beams of beams $LB_1$ and $LB_2$ synthesized as synthetic beam $LB_{12}$ is arranged, for example, by the analyzer, and the beams overlay each other so as to form an interference light, which is detected by the photodetector and is converted into an electric signal in accordance with the intensity of the interference light. In this case, the phase difference between the two beams changes, which changes the intensity of the interference light, by a relative movement of head 60C and scale plate 21 due to the movement of wafer stage WST in a measurement direction (in this case, the Y-axis direction). This change in the intensity of the interference light is detected by the photodetection system (not shown), and positional information corresponding to this intensity change is output to main controller 20 (refer to FIG. 6) as the main measurement value of Y encoder 70C.

As is obvious from the description above, in Y encoder 70C (encoder head 60C), since the optical path lengths of beams $LB_1$ and $LB_2$ are extremely short in the air, the influence of air fluctuation can mostly be ignored.

Other heads 60A, 603, and 60D (encoders 70A, 70B, and 70D) and the like are also configured similarly with head 60C (encoder 70C).

As described earlier, in the case a head is installed on wafer table WTB, the probability that the position of the head shifts from the design position or the attitude changes from a reference attitude is high due to the movement (acceleration added to wafer table WTB) and the like of wafer table WTB, and such a change in the position (including the attitude) of the head becomes a cause of error on position measurement of wafer table WTB (wafer stage WST). Therefore, in the embodiment, the secondary optical system $64_0$ previously described is provided to measure the change in the position and attitude of the head with respect to wafer table WTB in each of the heads 60A to 60D.

The secondary optical system $64_0$ inside housing 22 of head 60C shown in FIG. 5 will now be taken up representatively, and a configuration and the like of the secondary optical system will be described.

Inside fiber housing section 22b of housing 22, the secondary optical system $64_0$ is housed, consisting of a polarization beam splitter $PBS_0$ having a separation plane forming an angle of 45 degrees with the XY plane and the XZ plane, λ/4 plates WP and $WP_0$, reference mirror $RM_0$ and the like fixed to housing 22 via a support member (not shown) in a predetermined positional relation.

By beam splitter BS previously described, laser beam LB guided via the second section $62a_2$ of optical fiber 62a diverges into an incident beam of main optical system 64 and a measurement beam $LB_0$. Measurement beam $LB_0$ is incident on polarization beam splitter $PBS_0$ of the secondary optical system $64_0$, and is split by polarization into a measurement beam and a reference beam. The measurement beam is reflected by polarization beam splitter $PBS_0$ and proceeds along an optical path parallel to the Y-axis, and then passes through λ/4 plate WP and is incident on an inner wall surface on the +Y side of through-hole 24 of wafer table WTB, via an opening section (or a light transmitting section) provided in fiber housing section 22b (housing 22).

To the inner wall surface on the +Y side of through-hole 24 of wafer table WTB, mirror-polishing is applied, and a reflection surface RM which is perpendicular to the Y-axis is formed. Accordingly, the measurement beam is reflected by reflection surface RM, and follows the original optical path back returning to polarization beam splitter $PBS_0$. In this case, by passing through λ/4 plate WP twice, the polarization direction of the measurement beam rotates by 90 degrees from the original direction. Therefore, the measurement beam passes through polarization beam splitter $PBS_0$.

Meanwhile, the reference beam passes through polarization beam splitter $PBS_0$ and proceeds along an optical path parallel to the Z-axis, passes through λ/4 plate $WP_0$ and is incident on reference mirror $RM_0$, and then is reflected. The reflected reference measurement beam follows the original optical path back and passes through λ/4 plate $WP_0$ again, and returns to polarization beam splitter $PBS_0$. By the reference beam passing through λ/4 plate WP twice here, the polarization direction rotates by 90 degrees from the original direction. Therefore, the reference beam is reflected by polarization beam splitter $PBS_0$.

The measurement beam which has passed through polarization beam splitter $PBS_0$ is coaxially synthesized with reference beam reflected by polarization beam splitter $PBS_0$, and is incident on optical fiber 62c as synthetic beam $LB_0$. Synthetic beam $LB_0$ is sent to a second photodetection system (not shown) provided in stage main section 91, via optical fiber 62c.

Inside the second photodetection system (not shown), the polarization direction of the measurement beam and the reference beam synthesized as synthetic beam $LB_0$ is arranged, for example, by the analyzer and the beams overlay each other so as to form an interference light, which is detected by the photodetector and is converted into an electric signal in accordance with the intensity of the interference light. In the case, for example, when the setting position of head 60C shifts in the Y-axis direction, along with the movement of wafer table WTB, the relative distance between the secondary optical system 640 within head 60C and reflection surface RM changes. Because this changes the optical path length of the measurement beam, which changes the difference (optical path difference) of the optical path lengths between the measurement beam and the reference beam, the intensity of the interference light also changes. This change in the intensity of the interference light is detected by the photodetection system, and the relative position between head 60C and reflection surface RM in the Y-axis direction, or more specifically, information related to a relative position dY with wafer table WTB are output to main controller 20 as secondary measurement values of Y encoder 70C (head 60C).

Incidentally, an additional secondary optical system similar to secondary optical system $64_0$ can be arranged as well as secondary optical system $64_0$, and the additional secondary optical system can be placed away by a predetermined distance on the +Z side of secondary optical system $64_0$. For example, the first section of optical fiber 62a can be cut into two, and between the end surfaces of the two sections which have been cut, another beam splitter can be placed in a similar manner as beam splitter BS, and a part of laser beam LB proceeding toward main optical system 64 can be diverged and taken out by the beam splitter so that the beam serves as an incident beam with respect to the additional secondary optical system. As a matter of course, the synthetic beam of the measurement beam of the additional secondary optical system and the reference beam is sent to another photodetection system (a third photodetection system) via an optical fiber as is described above. In this case, as well as obtaining relative position dY of head 60C and wafer table WTB in the Y-axis direction as an average value of the secondary measurement values of secondary optical system $64_0$ and the additional secondary optical system, main controller 20 can also obtain a relative attitude (inclination) dθx of head 60C and wafer table WTB in the θx direction, based on a difference between the two secondary measurement values. In the following description, the two secondary optical systems described above are to be provided.

As described above, as an output of Y encoder 70C (head 60C), positional information Y (main measurement value) of head 60C in the Y-axis direction with respect to scale plate 21 and relative position dY (two secondary measurement values) of head 60C in the Y-axis direction with respect to wafer table WTB at different Z positions can be obtained. Therefore, main controller 20 computes relative position dY of head 60C in the Y-axis direction with respect to wafer table WTB and relative attitude dθx in the θx direction as is previously described, using the two secondary measurement values, obtains a correction amount ΔY (dY, θx) for positional information Y using the computation results of relative position dY and relative attitude dθx, and corrects positional information Y to Y+ΔY(dY, θx) by adding correction amount ΔY(dY, θx) to the measurement values of positional information Y. Incidentally, an operational circuit which computes relative position dY of head 60C in the Y-axis direction with respect to wafer table WTB and relative attitude dθx in the θx direction from the two secondary measurements can be arranged as a part of Y encoder 70C.

Incidentally, correction amount ΔY (dY, θx) can be obtain geometrically, from the position and attitude of head 60C which uses the upper surface of scale plate 21 as a reference. Or, main controller 20 can experimentally obtain correction amount ΔY (dY, θx) in the following manner, based on instructions from an operator. More specifically, main controller 20 performs simultaneous measurement of the position of wafer table WTB in the Y-axis direction and the θx direction for a plurality of predetermined sampling points, using encoder system 70 and wafer interferometer system 18 (refer to FIG. 6) which will be described later, while driving wafer table WTB, for example, in the Y-axis direction. Next, main controller 20 obtains a difference between the measurement value of Y encoder 70C (head 60C) and a predicted value of the measurement value of Y encoder 70C (head 60C) predicted from the measurement results of wafer interferometer system 18 for each of the plurality of sampling points. And main controller 20 obtains a function related to relative position dY of head 60C and relative attitude dθx that shows this difference, and the function is to be correction amount ΔY (dY, θx).

The two secondary optical systems as in head 60C (encoder 70C) are also provided in each of the other heads 60A, 60B, and 60D (encoders 70A, 70B, and 70D). However, main controller 20 computes relative position dX of heads 60B and 60D in the X-axis direction and relative attitude dθy in the θy direction of wafer table WTB, based on measurement values of heads 60B and 60D (encoders 70B and 70D). And, for these heads, main controller 20 obtains a correction amount ΔX (dX, θy) for a positional information X in the X-axis direction using the computation results of relative position dX and relative attitude dθy, and corrects positional information X to X+ΔX (dX, θy) by adding correction amount ΔX (dX, θy) to the measurement values of positional information X. Incidentally, also in this case, an operational circuit which computes the relative position of each head in the measurement direction with respect to wafer table WTB and the relative attitude in a direction of inclination of the measurement direction from the two secondary measurements can be arranged as a part of each of the encoders.

The measurement values of each head (60A to 60D) of encoder system 70 and the secondary measurement values are supplied to main controller 20. Main controller 20 performs a predetermined operation based on the secondary measurement values of each head as described above, obtains the correction amount for the positional information (for example, positional information Y for head 60C), and corrects the positional information adding the correction amount to the measurement values of the positional information. Then, main controller 20 measures the positional information (including information on the θz rotation quantity) of wafer table WTB (wafer stage WST) within the XY plane, using the measurement values which have been corrected of at least three heads (more specifically, at least three heads which output effective measurement values) facing the lower surface of scale plate 21 on which diffraction grating RG is formed.

Further, in exposure apparatus 100 of the embodiment, the position of wafer stage WST can be measured with wafer laser interferometer system (hereinafter referred to as "wafer interferometer system") 18 (refer to FIG. 6), independently from encoder system 70.

As shown in FIG. 2, wafer interferometer system 18 is equipped with a Y interferometer 18Y which irradiates a plurality of measurement beams in the Y-axis direction on reflection surface 17a of wafer table WTB, and an X interferometer which irradiates one or more than one measurement beams parallel to the X-axis direction on reflection surface 17b, and this X interferometer includes a plurality of, in the embodiment, two X interferometers $18X_1$ and $18X_2$.

The substantial measurement axis in the Y-axis direction of Y interferometer 18Y is a straight line in the Y-axis direction which passes through optical axis AX of projection optical system PL and the detection center of alignment system ALG which will be described later on. Y interferometer 18Y measures the positional information of wafer table WTB in the Y-axis direction and the θz direction (and the θx direction).

Further, the substantial measurement axis in the X-axis direction of X interferometer $18X_1$ is a straight line in the X-axis direction which passes through optical axis AX of projection optical system PL. X interferometer $18X_1$ measures the positional information of wafer table WTB in the X-axis direction and the θz direction (and the θy direction).

Further, the measurement axis of X interferometer $18X_2$ is a straight line in the X-axis direction which passes through the detection center of alignment system ALG. X interferometer $18X_1$ measures the positional information of wafer table WTB in the X-axis direction (and the θy direction).

Incidentally, instead of reflection surfaces 17a and 17b for example, a movable mirror consisting of a plane mirror can be attached to the end of wafer table WTB. Further, a reflection surface inclined at an angle of 45 degrees to the XY plane can be arranged on wafer table WTB, and the position of wafer table WTB in the Z-axis direction can be measured via the reflection surface.

The measurement values of each of the interferometers of interferometer system 18 are supplied to main controller 20. In the embodiment, however, positional information (including information on the θz rotation quantity) of wafer stage WST (wafer table WTB) within the XY plane is mainly measured by encoder system 70 described above, and the measurement values of interferometers 18Y, 18X1, and 18X2 are secondarily used in cases such as when long-term fluctuation (for example, by temporal deformation or the like of the scales) of the measurement values of encoder system 70 is corrected (calibrated), or as backup at the time of output abnormality in the encoder system.

Alignment system ALG is an alignment system of an off-axis method placed on the −Y side of projection optical system PL away by a predetermined distance, as shown in FIGS. 1 and 2. In the embodiment, as alignment system ALG, as an example, an FIA (Field Image Alignment) system is used which is a type of an alignment sensor by an image processing method that measures a mark position by illuminating a mark using a broadband (a wide band wavelength range) light such as a halogen lamp and performing image processing of the mark image. The imaging signals from alignment system ALG are supplied to main controller 20 (refer to FIG. 6), via an alignment signal processing system (not shown).

Incidentally, alignment system ALG is not limited to the FIA system, and an alignment sensor, which irradiates a coherent detection light to a mark and detects a scattered light or a diffracted light generated from the mark or makes two diffracted lights (for example, diffracted lights of the same order or diffracted lights being diffracted in the same direction) generated from the mark interfere and detects an interference light, can naturally be used alone or in combination as needed. As alignment system ALG, an alignment system having a plurality of detection areas like the one disclosed in, for example, U.S. Patent Application Publication No. 2008/0088843 can be employed.

Moreover, in exposure apparatus 100 of the embodiment, a multiple point focal point position detection system (hereinafter shortly referred to as a multipoint AF system) AF (not shown in FIG. 1, refer to FIG. 6) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 6) via an AF signal processing system (not shown). Main controller 20 detects positional information of the wafer W surface in the Z-axis direction at each detection point based on the detection signals of multipoint AF system AF, and performs a so-called focus leveling control of wafer W during the scanning exposure based on the detection results. Incidentally, multipoint AF system can be arranged in the vicinity of alignment system ALG and surface position information (unevenness information) of the wafer surface can be obtained beforehand at the time of wafer alignment, and at the time of exposure, the surface position information and measurement values of a different sensor (for example, an encoder, an interferometer and the like) detecting a position of the wafer table upper surface in the Z-axis direction can be used to perform the so-called focus leveling control of wafer W.

In exposure apparatus 100, furthermore, above reticle R, a pair of reticle alignment detection systems 13A and 13B (not shown in FIG. 1, refer to FIG. 6) of a TTR (Through The Reticle) method which uses light of the exposure wavelength is arranged. Detection signals of reticle alignment detection systems 13A and 13B are supplied to main controller 20 via an alignment signal processing system (not shown).

FIG. 6 is a block diagram showing a partially omitted control system related to stage control in exposure apparatus 100. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, on manufacturing devices, reticle alignment and baseline measurement of alignment system ALG are performed, in a procedure similar to an typical scanning stepper (a procedure disclosed in, for example, U.S. Pat. No. 5,646,413 and the like) using reticle alignment detection systems 13A and 13B, a fiducial plate (not shown) on wafer table WTB and the like previously described, and around this time, wafer alignment (Enhanced Global Alignment (EGA) which is disclosed in, for example, U.S. Pat. No. 4,780,617 and the like) and the like are performed.

Then, main controller 20 performs an exposure operation by the step-and-scan method, based on the measurement results of the baseline and the results of the wafer alignment, and a pattern of reticle R is transferred onto each of a plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area.

In exposure apparatus 100 of the embodiment, during the series of operations described above, of the plurality of encoder heads 60A to 60D configuring encoder system 70, while main controller 20 corrects the measurement values of at least three heads (more specifically, at least three heads which output effective measurement values) facing the lower surface of scale plate 21 on which diffraction grating RG is formed in the procedure previously described, wafer table WTB is driven within the XY plane, based on the measurement values after the correction.

As described above, according to exposure apparatus 100 of the embodiment, main controller 20 drives wafer table WTB (wafer stage WST), based on positional information (including the information of the θz rotation quantity) of wafer table WTB (wafer stage WST) within an XY plane measured via encoder system 70, and information related to the relative position between each of at least three encoder heads (more specifically, at least three encoder heads (at least three out of encoder heads 60A to 60D) which output effective measurement values) facing scale plate 21 (diffraction grating RG) and wafer table WTB that has been used when measuring the positional information. Accordingly, even in the case when the encoder head has moved with respect to wafer table WTB along with the drive of wafer table WTB (wafer stage WST), a highly precise measurement of the positional information of wafer table WTB (wafer stage WST), or in turn, a highly precise drive control of wafer table WTB (wafer stage WST) becomes possible.

Further, according to exposure apparatus 100 of the embodiment, because main controller 20 drives wafer stage WST (wafer table WTB) in the scanning direction with good precision synchronously with reticle R (reticle stage RST), while correcting the measurement values of at least three encoder heads which face scale plate 21 (diffraction grating RG) as described above based on information related to the relative position between each of the encoder heads and wafer table WTB also at the time of scanning exposure, a pattern of reticle R can be transferred onto wafer W with good precision, without being affected by the acceleration/deceleration of wafer stage WST before and after the scanning exposure.

Incidentally, in the embodiment above, the description was made assuming that heads 60A and 60C (encoders 70A and 70C) have sensitivity only for relative position dY with wafer table WTB in the Y-axis direction which is the measurement direction and for relative attitude (inclination) dθx with wafer table WTB in a direction of inclination (the θx direction) of the measurement direction. However, in the case heads 60A and 60C (encoders 70A and 70C) have sensitivity also for relative position dX with wafer table WTB in the X-axis direction and for relative attitude dθy with wafer table WTB in the θy direction, it is preferable to further arrange a secondary optical system to measure relative position dX and relative attitude dθy. In this case, main controller 20 obtains correction amount ΔY (dX, dY, dθx, and dθy) for positional information Y in the Y-axis direction, using measurement values of relative position dX and dY and relative attitude dθx and dθy, and corrects the measurement values of positional information Y by adding the correction amount.

Similarly, in the case heads 60B and 60D (encoders 703 and 70D) have sensitivity also for relative position dY with wafer table WTB in the Y-axis direction and for relative attitude dθx with wafer table WTB in the θx direction, it is preferable to further arrange a secondary optical system to measure relative position dY and relative attitude dθx. In this case, main controller 20 obtains correction amount ΔX (dX, dY, dθx, and dθy) for positional information X in the X-axis direction, using measurement values of relative position dX and dY and relative attitude dθx and dθy, and corrects the measurement values of positional information X by adding the correction amount. Incidentally, the correction amount can be obtained similarly in the manner previously described.

Incidentally, in the embodiment above, while the example has been described where a one-dimensional encoder whose measurement direction is in only one direction (the X-axis direction or the Y-axis direction) has been used for each of the heads 60A to 60D (encoders 70A to 70D), instead of these heads, a two-dimensional head (encoder) whose measurement direction is in the X-axis direction and the Y-axis direction can also be employed. In this case, the handling to acquire correction amounts ΔY (dX, dY, dθx, dθy) and ΔX (dX, dY, dθx, dθy) will become essential. More specifically, at least four secondary optical systems with a configuration similar to secondary optical system 64$_0$ are to be arranged in fiber housing section 22b of each of the heads. More particularly, two secondary optical systems having a measurement axis parallel to the Y-axis are to be arranged distanced apart in the Z-axis direction, and two secondary optical systems a measurement axis parallel to the X-axis are to be arranged distanced apart in the Z-axis direction. And, based on the secondary measurement values output by each of the secondary optical systems, main controller 20 computes relative positions dX and dY in the X-axis direction and the Y-axis direction and relative attitudes dθx and dθy in the θx direction and the θy direction of each of the heads with respect to wafer table WTB, and based on this computation result, obtains correction amounts ΔX (dX, dY, dθx, dθy) and ΔY (dX, dY, dθx, dθy) for positional information X and positional information Y, and the correction amounts are added so as to correct the measurement values of positional information X and positional information Y. Incidentally, the correction amount can be obtained similarly in the manner previously described.

Furthermore, when heads 60A to 60D (encoders 70A to 70D) have sensitivity also for relative position dZ with wafer table WTB and/or relative attitude (rotation) dθz, a secondary optical system to measure relative position dZ and/or relative attitude dθz is to be further arranged. Then, main controller 20 obtains the correction amount using measurement results (computation results) of relative positions dX and dY, relative attitudes dθx and dθy, relative positions dZ and/or relative attitude dθz, and corrects the measurement values of the positional information related to the measurement direction of each of the heads, by adding the correction amount. Incidentally, the correction amount can be obtained similarly in the manner previously described.

Incidentally, in the embodiment above, the case has been described as an example where an optical (non-contacting) displacement sensor (secondary optical system 640) was used to measure relative position (including the relative attitude) with respect to wafer table WTB for each of the heads 60A to 60D. However, instead of the displacement sensor, an acceleration sensor (80A, 80B, 80C, 80D) can also be used. In this case, measurement values of the positional information of wafer table WTB in the measurement direction and measurement values of the acceleration information that is added to the head are output from each of the heads. These measurement values are sent to main controller 20. Main controller 20 applies numerical processing to the measurement values of the acceleration information, and converts the information into the relative position of the head with wafer table WTB. Main controller 20 can correct the positional information of wafer table WTB as is previously described, using the relative position obtained by the conversion.

Further, the displacement sensor can be an encoder that has a head provided with a scale, or a contact type sensor as well as a non-contact type.

Further, in the embodiment above, while the case has been described where relative position (relative attitude) of each of the heads 60A to 60D with respect to wafer table WTB was measured using a displacement sensor at the time of scanning exposure and the like, and correction information was obtained to correct positional information of wafer table WTB based on the measurement results, besides this, a trial exposure (test exposure) can be performed in advance, and the correction information can be acquired based on the results.

Further, in the case of using acceleration information, the measurement system is not limited to an acceleration sensor, and for example, the acceleration information can be obtained from measurement information of the interferometer, or the measurement system to obtain the acceleration information does not have to be arranged, and displacement information of the head can be acquired from thrust information to move wafer table WTB (wafer stage WST). Although measurement errors occur not only by the movement of wafer table WTB (wafer stage WST), but also by heat deformation of wafer table WTB or a head, in the embodiment above, the measurement errors are also consequently corrected.

In the case of providing an encoder head on a wafer table (fine movement stage), measurement errors which occur due to tilt (rotation in the ex direction and the θy direction) of the wafer table (fine movement stage) and the encoder head is originally computed by the encoder system; therefore, in the case of computing relative attitude in the dθx and dθy in the θx direction and the θy direction as well as the relative position dX and dy of each of the heads in the X-axis direction and Y-axis direction with respect to wafer stage WST using the displacement sensor, and correcting the measurement values of positional information X and Y using the correction amount computed based on the computation results, the measurement errors due to tilt should not be doubly corrected.

Incidentally, in the embodiment above, the case has been indicated where the exposure apparatus is equipped with a single wafer stage, however, the present invention is not limited to this, and the present invention can also be applied to a multi-stage type exposure apparatus equipped with a plurality of wafer stages, as disclosed in, for example, U.S. Pat. No. 6,590,634, U.S. Pat. No. 5,969,441, U.S. Pat. No. 6,208,407 and the like. Further, the present invention can also be applied to an exposure apparatus equipped with a measurement stage including a measurement member (for example, a reference mark, and/or a sensor and the like) different from the wafer stage, as disclosed in, for example, International Publication No. 2005/074014. More specifically, in the case of an exposure apparatus equipped with a measurement stage, and positional information of the measurement stage is measured with an encoder, measurement errors of the encoder can be corrected as is previously described.

Furthermore, in a multi-stage type exposure apparatus equipped with a plurality of stages, such as, for example, an exposure apparatus equipped with two wafer stages, the present invention can also be applied similarly to correct measurement errors of an encoder which measures a position of the wafer stage within a measurement station in the case of measuring positional information (including mark information, surface position information and the like) of the wafer with the measurement station. In this case, measurement information of the encoder can be corrected from the displacement information of the encoder, or the measurement information of the mark position can be corrected. Further, when measuring the surface position information, the results are stored while associating the results with an XY coordinate, and the XY coordinate which is made to correspond can be corrected.

Further, in the embodiment described above, while the case has been described where encoder system 70 is equipped with a pair of X heads and a pair of Y heads, the present invention is not limited to this. More specifically, the number of encoder heads need not be specified, however, to measure the positional information (including information of the θz rotation quantity) of wafer stage WST in the XY plane, the encoder should have a total of three heads, including at least one X head and one Y head each. Further, in the case of employing a two-dimensional head instead of a one-dimensional head, the positional information (including information of the θz rotation quantity) in the XY plane of wafer stage WST can be measured if there is at least two two-dimensional heads.

Incidentally, the placement of the encoders (heads) on the wafer stage in the embodiment above is a mere example, and the present invention is not limited to this. For example, an encoder and a backup encoder can be placed on each of the four corners of the wafer stage along a radial direction from the stage center.

Further, in the case of placing an encoder head on a surface of a movable body such as wafer table WTB (wafer stage WST), a main section of the head can be placed inside the movable body while only the light-receiving section is placed on the surface.

Further, in the embodiment above, a sensor (or a head) which can measure positional information in the Z-axis direction can be used together, or a sensor (or a head) which can measure positional information in the X-axis direction and Y-axis direction, or a sensor (an X sensor) whose measurement direction is in the X-axis direction and a sensor (a Y sensor) whose measurement direction is in the Y-axis direction can be used in combination. Further, as well as a main sensor, a backup sensor can be provided which is used for backup at the time of output abnormality of the main sensor, and in the case of arranging a plurality of groups of a main sensor and a backup sensor, each group can be concurrently use a grating of the fine movement stage.

Further, in the embodiment above, while the encoder could measure positional information in at least one of the X-axis direction and the Y-axis direction, as well as this, for example, the encoder can be an encoder which performs measurement only in the Z-axis direction.

Further, in the embodiment described above, while the case has been described where a two-dimensional diffraction grating was formed on the lower surface of scale plate 21, as well as this, an X grating whose periodic direction is in the X-axis direction and a Y grating whose periodic direction is in the Y-axis direction can be formed in combination on the lower surface of scale plate 21, as long as the placement of the gratings corresponds to the movement path (the movement path of each of the heads) of the wafer stage. Further, scale plate 21 can be configured combining a plurality of scale plates. Or, a scale can be placed so that at least a measurement using an encoder is possible in the exposure operation and in the alignment operation.

Further, for example, in an exposure apparatus whose projection optical system and alignment system are spaced apart, different scale plates can be provided in the vicinity (periphery) of the projection optical system and in the vicinity (periphery) of the alignment system. In this case, when exposure operation of wafer W is performed, the position of the wafer stage is measured by the encoder system, using the scale board placed in the vicinity of the projection optical system, and on wafer alignment and the like, the position of the wafer stage is measured by the encoder system, using the scale board placed in the vicinity of the alignment system.

Further, in the embodiment above, while the case has been described where a wafer interferometer system was arranged in addition to the encoder system, the wafer interferometer system does not necessarily have to be arranged.

Further, in the embodiment above, while the case has been described where the light source and the photodetection system (including the photodetector) are placed external (stage main section 91) to heads 60A to 60D, and light (measurement beam) from the light source incident on the encoder head and the light returning to the photodetector from the encoder head are both guided between the light source, the photodetection system, and each of the heads 60A to 60D using optical fibers 62a to 62c, the present invention is not limited to this. For example, in the case there is a light source such as a semiconductor laser within the encoder head, each of the encoder heads and the photodetection system (including the photodetector) only have to be optically connected by an optical fiber. Or, the encoder head can have a photodetection system (including a photodetector) within an encoder head. In this case, when the light source is arranged external to each head, light-transmitting of the measurement beams from the light source via the optical fiber can be performed between the light source and the head in the manner similar to the embodiment described above.

Further, in the embodiment described above, instead of each of the optical fibers previously described, other light-transmitting optical systems such as a relay optical system and the like can also be used. Further, in the embodiment above, while the case has been indicated where a light source and a photodetection system (including the photodetector), which are optically connected via each of the heads 60A to 60D and an optical fiber, are placed at stage main section 91, not all of the parts such as the light source and the photodetection system (including the photodetector) have to be placed at stage main section 91.

Further, in order to improve the positioning precision of wafer table WTB (fine movement stage), air transmission of a laser beam and the like can be performed between stage main section 91 (rough movement stage) and wafer table WTB (fine movement stage) (hereinafter shortly referred to as a rough/fine movement stage), or a configuration can be employed where a head is provided in stage main section 91 (rough movement stage) so as to measure a position of stage main section 91 (rough movement stage) using the head and to measure relative displacement of the rough/fine movement stage with another sensor.

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus in the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or an ion beam. Furthermore, the present invention can be applied to a liquid immersion type exposure apparatus which has liquid filled in the space between the projection optical system and the wafer disclosed in, for example, U.S. Patent Application Publication No. 2005/0259234 and the like. In the case of a liquid immersion exposure apparatus, a head used for position measurement of the wafer stage can be switched, not only during the exposure operation but also during other operations, such as, for example, reference mark detection, or measurement using a sensor on the wafer stage (such as an uneven illumination measuring sensor, an aerial image measuring sensor, an irradiation measuring sensor, a polarization sensor, a wavefront measurement sensor and the like), from a head which comes into contact with the liquid to other heads. However, the wafer stage will need to have at least one measurement member (such as a sensor), and a liquid immersion domain will have to be formed on the wafer stage. The switching of the head can be performed, based on results of detecting the heads which come into contact with the liquid from the output of the liquid detection sensor, the output of the encoder and the like, or the head which obviously comes into contact with the liquid in the exposure sequence can simply be changed in advance to other heads, without performing any of the liquid detection.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder.

Further, as is disclosed in, for example, International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment and the modified example above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body system of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all of the publications (including the International Publications), the U.S. patent application Publication descriptions and the U.S. patent descriptions that are cited in the description so far related to exposure apparatuses and the like are each incorporated herein by reference.

Incidentally, semiconductor devices are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus in the embodiment above is used in the lithography step, devices having high integration can be produced with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes a substrate with an exposure beam via a projection system, the apparatus comprising:
   a frame supporting the projection system;
   a base placed under the projection system supported by the frame;
   a substrate stage having a table that mounts the substrate and placed on the base;
   a measurement device that has a plurality of heads that are provided at the table and each irradiate a measurement beam on a grating section supported by the frame, and measures positional information of the table by a head, of the plurality of heads, that faces the grating section;
   a drive device that drives the substrate stage supported by levitation on the base, to move the substrate;
   a measurement system that measures, in a noncontact manner, displacement information, at the table, of a head used in measurement of the positional information; and
   a controller that controls the drive device to drive the substrate stage based on the displacement information measured by the measurement system and the positional information measured by the measurement device.

2. The exposure apparatus according to claim 1, wherein the displacement information includes displacement information of the head at the table in a measurement direction of the positional information of the table measured by the measurement device.

3. The exposure apparatus according to claim 1, wherein the grating section is supported by the frame so that a lower surface of the grating section is substantially parallel to a predetermined plane orthogonal to an optical axis of the projection system, and
   the displacement information includes displacement information of the head at the table in a direction parallel to the predetermined plane.

4. The exposure apparatus according to claim 3, wherein the measurement system includes another measurement device different from the measurement device, which measures positional information of the table, and
   the displacement information is determined from measurement information of the another measurement device.

5. The exposure apparatus according to claim 3, wherein the grating section has a reflective two-dimensional grating, surrounds the projection system and is placed substantially parallel to the predetermined plane.

6. The exposure apparatus according to claim 5, further comprising:
   a mark detection system placed apart from the projection system, which detects a mark of the substrate; and
   another grating section different from the grating section and placed surrounding the mark detection system, wherein
   the measurement device measures positional information of the table by a head, of the plurality of heads, that faces the another grating section in detection of the mark by the mark detection system.

7. The exposure apparatus according to claim 6, wherein during the drive of the substrate stage, positional information of the table is measured by at least three heads, of the plurality of heads, that face the grating section, and
   the controller controls the drive of the substrate stage while correcting the measured positional information based on the displacement information or the correction information.

8. The exposure apparatus according to claim 7, further comprising:
   a mask stage that holds a mask having a pattern irradiated with the exposure beam, wherein
   the measurement device has an encoder system that measures positional information of the mask stage.

9. The exposure apparatus according to claim 8, wherein the substrate stage has a main section that supports the table in a noncontact manner, and
   the drive device has a drive mechanism that moves the table with respect to the main section, and a planar motor having a magnet unit provided at one of the main section and the base and a coil unit provided at the other of the main section and the base, and the drive device moves the substrate stage on the base by the planar motor.

10. The exposure apparatus according to claim 9, wherein the planar motor is based on a moving magnet method in which the magnet unit is provided at the main section.

11. The exposure apparatus according to claim 9, wherein the substrate stage is magnetically levitated on the base by the planar motor.

12. The exposure apparatus according to claim 5, wherein the plurality of heads include heads that are respectively placed at four corner sections of the table.

13. The exposure apparatus according to claim 5, wherein the plurality of heads include four heads that are placed in pairs on two diagonal lines, respectively, with a substrate mounted on the table in between.

14. The exposure apparatus according to claim 1, wherein the measurement system includes a sensor, at least a part of the sensor being provided at the head.

15. The exposure apparatus according to claim 1, wherein the measurement system includes a sensor that measures information on an acceleration of the substrate stage.

16. The exposure apparatus according to claim 1, wherein the displacement information is obtained beforehand, and the controller uses the displacement information obtained beforehand in control of the drive device for driving the substrate stage.

17. A device manufacturing method, comprising:
exposing a substrate using the exposure apparatus according to claim 1; and
developing the exposed substrate.

18. An exposure method of exposing a substrate with an exposure beam via a projection system, the method comprising:
driving a substrate stage that is supported by levitation on a base placed under the projection system and has a table that mounts the substrate;
measuring positional information of the table by a head, of a plurality of heads of a measurement device, that faces a grating section supported by a frame that supports the projection system, the measurement device having the plurality of heads that are provided at the table and each irradiate a measurement beam on the grating section; and
controlling a drive of the substrate stage based on displacement information, at the table, of a head used in measurement of the positional information and the positional information measured by the measurement device, the displacement information being measured in a noncontact manner with a measurement system.

19. The exposure method according to claim 18, wherein the displacement information includes displacement information of the head at the table in a measurement direction of the positional information of the table measured by the measurement device.

20. The exposure method according to claim 18, wherein the grating section is supported by the frame so that a lower surface of the grating section is substantially parallel to a predetermined plane orthogonal to an optical axis of the projection system, and
the displacement information includes displacement information of the head at the table in a direction parallel to the predetermined plane.

21. The exposure method according to claim 20, wherein the measurement system includes another measurement device different from the measurement device, which measures positional information of the table, and the displacement information is determined from measurement information of the another measurement device.

22. The exposure method according to claim 20, wherein the grating section has a reflective two-dimensional grating, surrounds the projection system and is placed substantially parallel to the predetermined plane.

23. The exposure method according to claim 22, wherein a mark of the substrate is detected by a mark detection system placed apart from the projection system, and
positional information of the table is measured by a head, of the plurality of heads, that faces another grating section in detection of the mark by the mark detection system, the another grating section being different from the grating section and placed surrounding the mark detection system.

24. The exposure method according to claim 23, wherein during the drive of the substrate stage, positional information of the table is measured by at least three heads, of the plurality of heads, that face the grating section, and
the drive of the substrate stage is controlled while the measured positional information is corrected based on the displacement information or the correction information.

25. The exposure method according to claim 24, wherein positional information of a mask stage is measured by an encoder system different from the plurality of heads, the mask stage holding a mask having a pattern irradiated with the exposure beam.

26. The exposure method according to claim 25, wherein the table is supported by a main section in a noncontact manner and is moved with respect to the main section, and
the substrate stage is moved by a planar motor having a magnet unit provided at one of the main section and the base and a coil unit provided at the other of the main section and the base.

27. The exposure method according to claim 26, wherein the planar motor is based on a moving magnet method in which the magnet unit is provided at the main section.

28. The exposure method according to claim 26, wherein the substrate stage is magnetically levitated on the base by the planar motor.

29. The exposure method according to claim 22, wherein the plurality of heads include heads that are respectively placed at four corner sections of the table.

30. The exposure method according to claim 22, wherein the plurality of heads include four heads that are placed in pairs on two diagonal lines, respectively, with a substrate mounted on the table in between.

31. The exposure method according to claim 18, wherein the displacement information is measured by a sensor at least a part of which is provided at the head.

32. The exposure method according to claim 18, wherein the displacement information includes information on an acceleration of the substrate stage.

33. The exposure method according to claim 18, wherein the displacement information is obtained beforehand, and the displacement information obtained beforehand is used in drive control of the substrate stage.

34. A device manufacturing method, comprising:
exposing a substrate using the exposure method according to claim 18; and
developing the exposed substrate.

35. A method of making an exposure apparatus that exposes a substrate with an exposure beam via a projection system, the method comprising:

supporting the projection system with a frame;

placing a base under the projection system supported by the frame;

placing a substrate stage having a table that mounts the substrate, on the base;

providing a measurement device that has a plurality of heads that are provided at the table and each irradiate a measurement beam on a grating section supported by the frame, and measures positional information of the table by a head, of the plurality of heads, that faces the grating section;

providing a drive device that drives the substrate stage supported by levitation on the base, to move the substrate;

providing a measurement system that measures, in a noncontact manner, displacement information, at the table, of a head used in measurement of the positional information; and providing a controller that controls the drive device to drive the substrate stage based on the displacement information measured by the measurement system and the positional information measured by the measurement device.

* * * * *